United States Patent [19]
Miller

[11] Patent Number: 4,811,191
[45] Date of Patent: Mar. 7, 1989

[54] CMOS RECTIFIER CIRCUIT

[75] Inventor: Gary L. Miller, Santa Clara, Calif.

[73] Assignee: Catalyst Semiconductor, Inc., Santa Clara, Calif.

[21] Appl. No.: 173,954

[22] Filed: Mar. 28, 1988

[51] Int. Cl.[4] .......................................... H02M 7/217
[52] U.S. Cl. ...................................... 363/127; 363/49; 363/53; 307/261; 307/321
[58] Field of Search ................... 363/49, 52, 53, 125, 363/126, 127; 323/901; 307/261, 317 R, 321

[56] References Cited

U.S. PATENT DOCUMENTS 3,588,671  6/1971  Deboo et al. ........................ 363/127
4,280,175  7/1981  Leuthold ............................. 363/127
4,319,144  3/1982  King et al. .......................... 363/127

Primary Examiner—Peter S. Wong
Attorney, Agent, or Firm—Skjerven, Morrill, MacPherson, Franklin & Friel

[57] ABSTRACT

Disclosed is a rectifier circuit which utilizes field effect transistors, and which includes current sensing resistors to adjust the drive to the field effect transistors to avoid forward biasing the intrinsic bipolar transistor in the field effect transistors to thereby avoid injecting current into the substrate where the field effect transistors are formed on a common substrate. In addition, the current sensing resistors provide a fast startup, which is achieved both in the case where the field effect transistors are formed on a common substrate as well as those implementations where the field effect transistors do not share a common substrate. Current limiting resistors are also included to prevent overloading the field effect transistors and injecting current into the substrate when the field effect transistors share a common substrate.

19 Claims, 2 Drawing Sheets

CMOS RECTIFIER CIRCUIT

BACKGROUND OF THE INVENTION

1. Field of the Invention

This invention relates to rectifier circuits and more particularly to a CMOS half wave and full wave rectifier circuit.

2. Description of the Prior Art

Under a number of circumstances, it is desirable to provide a CMOS rectifier circuit on a common substrate with other circuitry, however this can result in the problem of current injection from the rectifier into the substrate, resulting in latch-up of the attached circuitry and the destruction of other semiconductor devices included on the same substrate. The latch-up problem can occur on startup, that is beginning the cycle with no input to the rectifier circuit and no output being provided by the rectifier circuit. During the charging o the typical filter capacitor to bring the output voltage up to the desired level, injection of current into the substrate can cause the aforementioned latch-up problem. Secondly, when excessive input current is applied to in prior art circuitry, the current becomes so large that it forward biases the drain to substrate diode which turns on the inherent parasitic bipolar transistor resulting in the injection of current into the substrate, which can destroy other semiconductor devices sharing a common substrate. Also, with typical prior art rectifier circuits, which will be described more fully hereinafter, on startup a certain amount of current is shunted around the field effect transistor and is not passed through the rectifying diode to charge the filter capacitor to bring it up to the desired output voltage and this undesired shunting of current results in a delay in charging the filter capacitor to the desired output level.

A typical field effect transistor in full wave rectifier of the type utilized in the prior art is utilized in FIG. 1. FIG. 2 illustrates one half of the full wave rectifier of FIG. 1, and will be used to illustrate the typical problems involved in prior art rectifier circuits, including the shunting of current around the principal conducting path because of the parasitic bipolar device inherent in field effect transistors.

Referring to FIG. 1, full wave rectifier circuit 1 is illustrated and includes input terminals AC1 and AC2 for receiving an alternating current input signal to be rectified by the circuitry and provide DC+ and DC− output voltage at output terminals 2 and 3 respectively. Included in full wave rectifier circuit 1 are a P-channel field effect transistor P1 and a P-channel field effect transistor P2, each of which includes a drain, source, gate, and body as illustrated in FIG. 1.

The gate of field effect transistor P2 is connected to input terminal AC1 by conductor 4 and the gate of field effect transistor P1 is connected to input terminal AC2 by conductor 5. The source of field effect transistor P1 is connected to the positive output terminal 2 by conductor 6, and the source of field effect transistor P2 is also connected to conductor 6. The drain of field effect transistor P1 is connected to conductor 4 and the drain of FET P2 is connected to conductor 5 to provide a path for input current, respectively, when the potential on AC1 is positive and when AC2 is positive. As is conventional with field effect transistor devices, the body and source are connected, and in circuit 1 the body of FET P1 is connected to the source of FET P1 via conductor 7 and similarly the body of FET P2 is connected to the source of FET P2 by conductor 8. Anode 9 of diode D1 is connected to output terminal 3 via conductor 10 and cathode 11 of diode D1 is connected to conductor 4. Diode D2 is connected between conductor 5 and conductor 10, with anode 12 being connected to conductor 10 and cathode 13 being connected to conductor 5. Filter capacitor $C_f$ has one plate connected to conductor 6 and its other plate connected to conductor 10 and resistor RL (which represents the load for full wave rectifier 1) is also connected between conductor 6 and conductor 10. Also included in full wave rectifier 1 is voltage clamp 14 which is connected between conductor 6 and conductor 10 and functions to shunt excess current away from load resistor RL in the presence of large input signals to limit the peak output voltage to a level below the breakdown voltage for the devices connected to conductors 6 and 10. Voltage clamp 14 may typically be a Zener diode or other suitable device which will accomplish the current shunting function.

The above noted problems with the typical prior art circuit, such as circuit 1, at startup and with overvoltage, will be illustrated with respect to a one-half cycle operation, illustrated in FIG. 2, which shows the conduction when the potential at input terminal AC1 is positive with respect to the potential at input terminal AC2. The first problem of startup occurs when filter capacitor $C_f$ is discharged and the output voltage between terminals 2 and 3 is zero. During the cycle of conduction in which AC1 is positive with respect to AC2, current flows from input terminal AC1 through FET P1, filter capacitor $C_f$, diode D2 and back to input terminal AC2. At startup, the drive to turn on FET P1 ($V_{GS}$) is provided by the voltage difference between input terminal AC1 and AC2. With no charge on filter capacitor $C_f$, the drive voltage $V_{GS}$ to FET P1 will be limited to the voltage drop across diode D2 which is not sufficient to turn on FET P1, and this results in the drain to body diode forward biasing. The forward biased drain to body diode of FET P1 turns on the parasitic bipolar device inherent in FET P1, which results in the injection of large currents into the substrate which can cause the latch-up of other devices on the same substrate, resulting in the destruction of those devices.

The second limitation of prior art circuit 1 occurs when voltage clamp 14 is used to shunt excess current from load RL. To avoid large substrate currents with voltage clamp 14 in place, the peak AC input current to terminals AC1 and AC2 must not exceed a magnitude which causes the input current $I_p$ times the "on" resistance of FET P1 to exceed 0.6 volts. This voltage turns on the drain to body diode and injects current into the substrate through the parasitic bipolar device in the same manner as described above. For full wave rectifier circuit 1, the "on" resistance of FETs P1 and P2 is limited by the finite switch drive ($V_{GS}$) determined by the voltage across clamp 14. It will of course be appreciated that the analogous problem results with FET P2 during the cycle in which the voltage at AC2 is positive with respect to the voltage at AC1.

From the foregoing it will be appreciated that the prior art presents the problems of injecting current into the substrate, which when the substrate is common with that used for other devices can destroy such devices; and in addition, because of the parasitic bipolar device inherent with the FETs the rectifier circuit is slow at startup in providing output DC potential because of the shunting of current around the load and filter capacitor.

SUMMARY OF THE INVENTION

It is an object of the present invention to provide a rectifier circuit which is capable of providing a full output voltage more quickly than previously achievable by prior art circuits.

It is another object of the present invention to provide a CMOS compatible rectifier circuit which does not inject current into the substrate during power-up.

It is yet another object of the present invention to provide a rectifier circuit capable of handling excess input currents without resulting in the injection of current into the substrate.

In accordance with the invention, a rectifier circuit is provided which comprises first and second terminals for receiving an alternating current; third and fourth terminals for providing a rectified output voltage; a first field effect transistor having a gate, a drain region of first conductivity type and a source region of first conductivity type disposed in a body of second conductivity type; first impedance means connected between the drain region of said first field effect transistor and said first terminal; means electrically connecting the body and the source region of said first field effect transistor to said third terminal; a second field effect transistor having a gate, a drain region of first conductivity type and a source region of first conductivity type disposed in a body of second conductivity type; second impedance means connected between the drain region of said second field effect transistor and said first terminal; means electrically connecting the body and source region of said second field effect transistor to said third terminal; means electrically connecting the gate of said first field effect transistor to the gate of said second field effect transistor; means electrically connecting the gate of said first field effect transistor and the gate of said second field effect transistor to said second terminal; rectifier means having an anode and a cathode; means electrically connecting the anode of said rectifier means to said fourth terminal; and third impedance means connecting the cathode of said rectifier means to said second terminal.

As another feature of the present invention, a rectifier circuit as set forth above is provided wherein the first field effect transistor and the second field effect transistor are included on a common body of semiconductor material.

As yet another feature of the invention, a rectifier circuit is provided in accordance with the above wherein the means electrically connecting the gate of said first field effect transistor and the gate of said second field effect transistor to the second terminal comprises impedance means.

As another feature of the invention, a rectifier circuit is provided as set forth above wherein the first conductivity type is P.

As a further feature of the invention, a rectifier circuit is provided as set forth in the first above-mentioned feature in which the first conductivity type is N and the rectifier means comprises a field effect transistor connected to function as a diode.

In accordance with an additional feature of the invention, a rectifier circuit is provided as set forth in the first above-mentioned feature in which the first conductivity type in N and the rectifier means comprises a bipolar transistor connected to function as a diode.

In accordance with yet another feature of the invention, a rectifier circuit is provided as set forth in the first above-mentioned feature in which the first conductivity type is P and the rectifier means comprises a bipolar transistor connected to function as a diode.

As a further feature of the invention, a rectifier circuit is provided in accordance with the first above-mentioned feature wherein the first and second field effect transistors are included on a common semiconductor body, and wherein the first, second and third impedance means are comprised of polycrystalline silicon material.

In accordance with a further feature of the invention, a rectifier circuit is provided in accordance with the first above-mentioned feature wherein the first impedance means, second impedance means and third impedance means are each comprised of thin film resistors.

BRIEF DESCRIPTION OF THE DRAWINGS

Other objects and advantages of the invention will become apparent from a study of the specification and drawings in which.

DETAILED DESCRIPTION OF THE PREFERRED EMBODIMENTS

Figure 3:
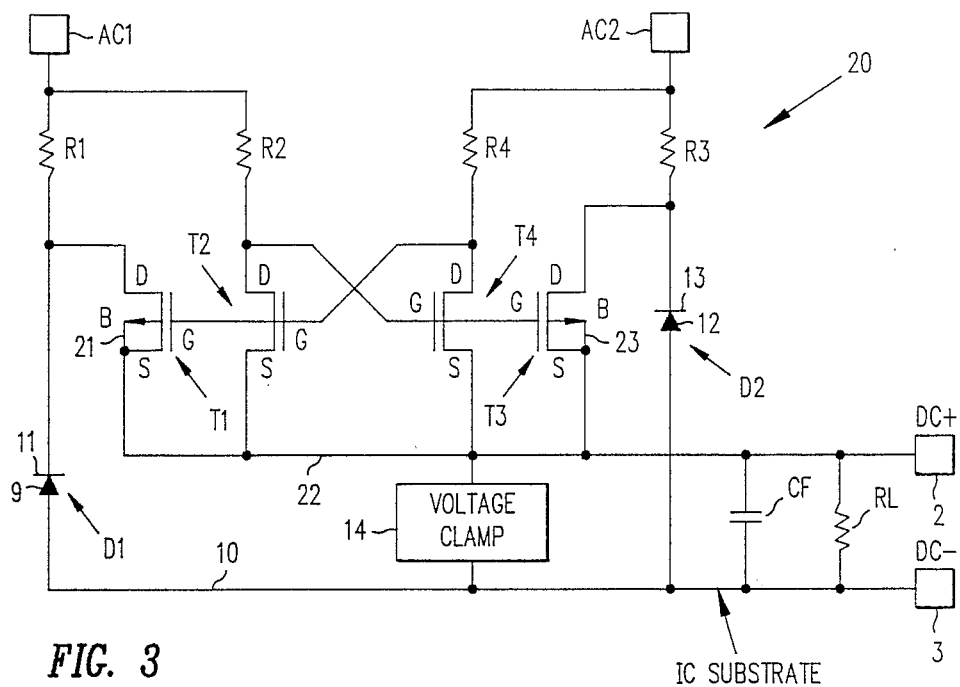
FIG. 3 illustrates a full wave rectifier circuit in accordance with the present invention.
Figure 4:
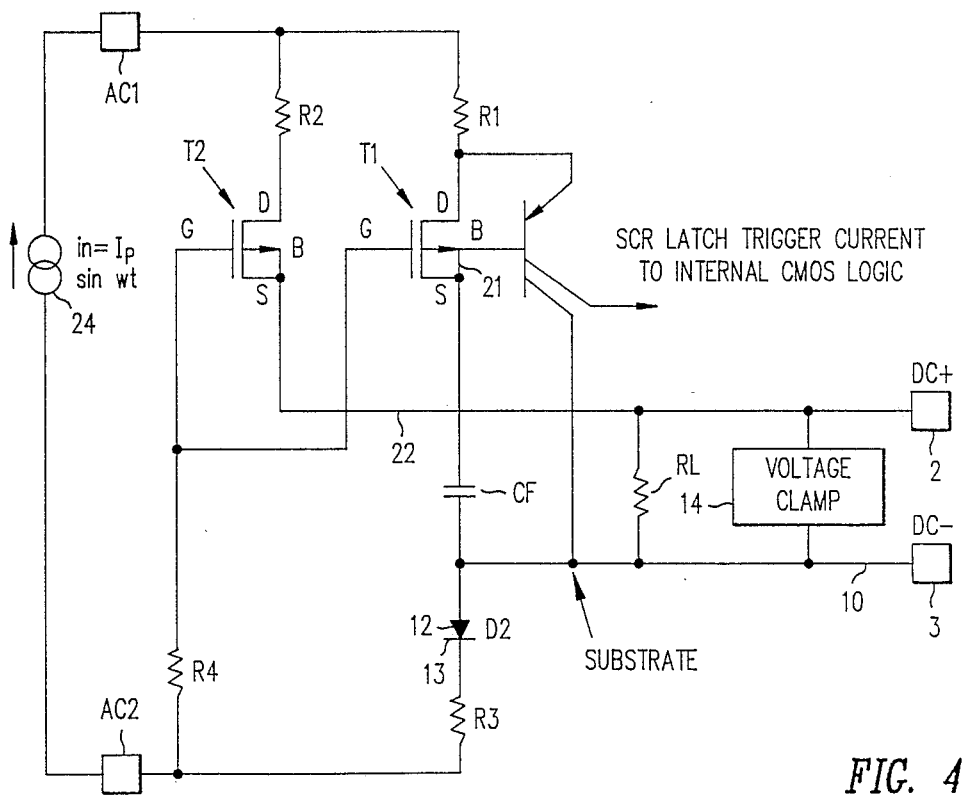
FIG. 4 illustrates one half of the circuit of FIG. 3.

Referring to FIG. 3, improved rectifier circuit 20 is illustrated which includes field effect transistors T1, T2, T3 and T4, together providing a full wave rectifier for taking an alternating current received at input terminals AC1 and AC2 and providing a rectified output voltage at output terminals 2 and 3. FIG. 4 illustrates one-half of full wave rectifier circuit 20 and the operation of rectifier circuit 20 will be explained in connection with FIG. 4, which explanation will be provided hereinafter. Common components in full wave rectifier circuit 1 and full wave rectifier circuit 20 have corresponding reference characters. It will be appreciated by reference to FIG. 3 that field effect transistors T1, T2, T3 and T4 are of the P-channel type and in one embodiment are included in a common substrate utilizing N-well technology. The invention may, however, be practiced by utilizing N-channel transistors and P-well CMOS technology.

Figure 1:
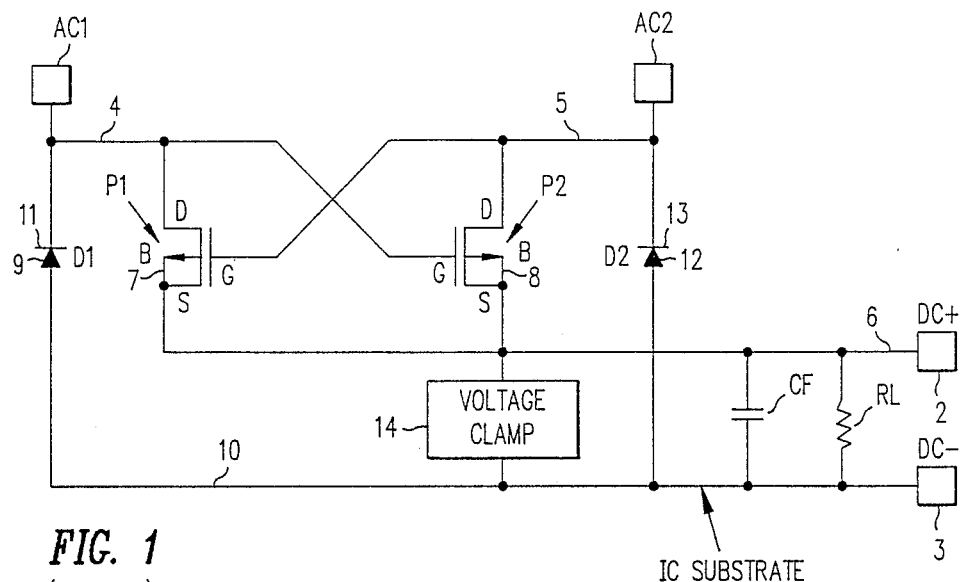
FIGS. 1 and 2 illustrate prior art rectifier circuits.
Figure 2:
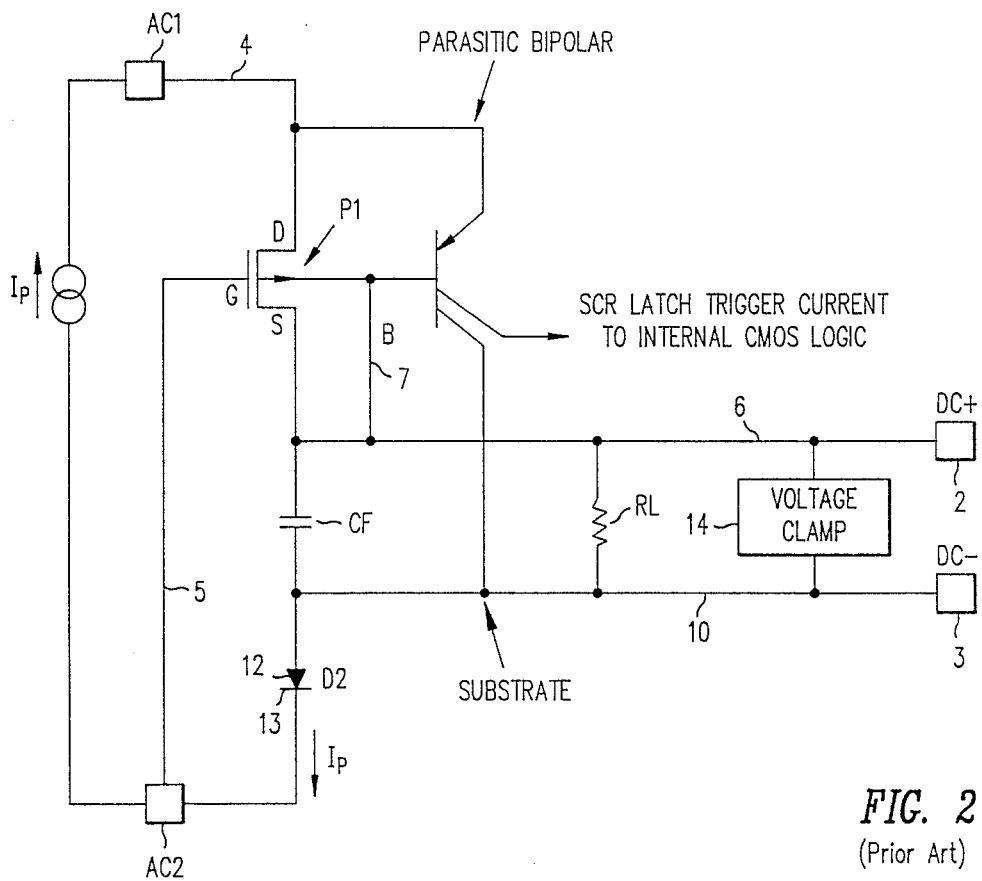

Turning to the details of rectifier circuit 20, the drain of the first field effect transistor, transistor T1, is connected to input terminal AC1 by means of resistor R1, the body and source of field effect transistor T1 are connected in common by conductor 21, and the commonly connected body and source are connected to output terminal 2 by conductor 22. A second field effect transistor, transistor T2, includes a drain which is connected to input terminal AC1 by resistor R2, a source which is connected to conductor 22 and a gate which is commonly connected to the gate of transistor T1. The source and body of transistor T2 are commonly connected, as is traditional with field effect transistors. The commonly connected gates of transistors T1 and T2 are connected via resistor R4 to second input terminal AC2. In similar fashion to that utilized in prior art circuit 1 of FIG. 1, diode D1 is connected between output terminal 3 and provides a conduction path for current to flow when AC2 is positive with respect to AC1. However, in this embodiment, cathode 11 of diode D1 is connected to AC1 through resistor R1. As in FIG. 1, conductor 10 connects anode 9 of diode D1 to output terminal 3. Also, in rectifier circuit 20, diode D2 provides a path for conduction of current when AC1 is positive with respect to AC2, the conduction path through diode D2 being provided by the connection of conductor 10 to anode 12 and the connection of cathode 13 to AC2 by resistor R3. Full wave rectifier circuit 20 also includes voltage clamp 14 connected between conductor 10 and 22, filter capacitor $C_f$ also connected between conductors 10 and 22 and load RL similarly connected between conductors 10 and 22.

The second half of full wave rectifier circuit 20 (that is the portion of circuit 20 which provides the path for current conduction when AC2 is positive with respect to AC1 includes field effect transistors T3 and T4, which serve as part of the current conduction path during the portion of the cycle in which AC2 is positive in respect to AC1. The drain of the third field effect transistor, transistor T3, is connected to input terminal AC2 via resistor R3, the body and source are connected together by means of conductor 23 and the source of field effect transistor T3 is connected to output terminal 2 via conductor 22. The drain of the fourth FET, transistor T4, is connected to input terminal AC2 via resistor R4 and the source of transistor T4 is connected to output terminal 2 via conductor 22. The gates of third transistor T3 and fourth transistor T4 are connected in common and the commonly connected gates are connected to the lower end of resistor R2. As will be described more fully hereinafter, resistors R1 and R3 are current sensing resistors, being utilized to sense the current flowing into input terminals AC1 and AC2 to adjust the switch drive to the pair of transistors which are conducting during the particular cycle. Briefly, the current flowing through resistor R3 (which occurs when AC1 is positive with respect to AC2) provides the switch drive to transistors T1 and T2 which will be conducting when AC1 is positive with respect to AC2. In similar fashion, current flowing through resistor R1 provides the drive to transistors T3 and T4 when AC2 is positive with respect to AC1. In rectifier circuit 20, field effect transistors T2 and T4 monitor the input voltage at AC1 and AC2 and determine when to switch off field effect transistors T1 and T3. Resistors R2 and R4 limit the current into field effect transistors T2 and T4, avoiding the problem of the prior art of injecting substrate currents during start up and when high input voltages are received at terminals AC1 and AC2. Additionally, resistors R2 and R4 serve as the path to provide drive voltage to, in the case of R2, the gates of transistors T3 and T4, and in the case of R4 to the gates of transistors T2 and T1. In the operation of the circuit, when transistors T1 and T2 are conducting, transistors T3 and T4 are nonconducting. Thus the gates of transistors T1 and T2 are driven by the voltage at the upper end of R3, with the gates of transistor T1 and T2 sensing this voltage at the upper side of resistor R3 since with transistor T4 being nonconducting there is no voltage drop across resistor R4.

As an aid to explaining the operation of rectifier circuit 20, attention is directed to FIG. 4 in which one half of rectifier circuit 20 is illustrated showing how the half wave rectifier of rectifier circuit 20 operates. For purposes of explanation, it will be assumed that AC1 is positive with respect to AC2 and the current flows as indicated by current source symbol 24, with the current flowing in the direction indicated by the arrow adjacent to current source 24. During initial power-up of the circuit, filter capacitor $C_f$ is discharged and the total switch drive ($V_{GS}$) is equal to the input current flowing through capacitor $C_f$ multiplied by the resistance of resistor R3 plus the voltage drop across diode D2 ($V_{D2}$) As the input current increases, the switch drive to field effect transistors T1 and T2 increases because of the current flowing through resistor R3, and accordingly the "on" resistance of field effect transistors T1 and T2 decreases which prevents their drain to body diodes from being forward biased, which in turn minimizes current to the substrate via the intrinsic bipolar transistor. It will be appreciated that the current sensing provided by resistor R3 prevents the problem encountered in the prior art on startup. Of course, when the input voltage to AC2 is positive with respect to AC1, the operation of the circuit is analogous to that described above, with transistors T3 and T4 conducting and transistors T1 and T2 not conducting. Operation of the circuit under these conditions will be obvious to those skilled in the art in light of the foregoing explanation and therefore does not require explanation.

Also, current sensing provided by resistors R1 and R3 provides additional switch drive when the voltage clamp is enabled For example, when voltage clamp 14 is enabled, and AC1 is positive with respect to AC2, additional switch drive is provided to field effect transistors T1 and T2 by the voltage drop across R3. In so doing, the input current required to forward bias the drain-body diode of transistor T1 is increased, which decreases the currents to the substrate via the intrinsic bipolar transistor.

Also, from the foregoing it will be appreciated that the output voltage will rise to its predetermined level more quickly than in the prior art since current sensing resistors R1 and R3 provide the required drive voltage to the gates associated with R1 and R3 and this prevents the triggering of the intrinsic bipolar transistors which shunts input current to the substrate rather than requiring the input current to flow through filter capacitor $C_f$ and through the associated diode-resistor combination (D2 R3 when AC1 is positive with respect to AC2, and D1 R1 when AC2 is positive with respect to AC1).

Although the invention has been illustrated in connection with full wave rectifier circuit 20, it will of course be appreciated that the invention may be employed in, and is equally applicable to, half wave rectifier circuits as illustrated in FIG. 4.

It will of course also be appreciated from the foregoing that the rectifier circuits illustrated in FIGS. 3 and 4 provide improved performance over that of the prior art both with respect to cases where the circuits to be powered by the output voltage from the rectifier circuit shares a common substrate with the field effect transistors of the rectifier circuit, as well as providing an improved rectifier circuit where the field effect transistors of the rectifier circuit do not share a common substrate with devices of the circuits being powered by the output voltage from the rectifier circuit. In implementing the invention, when field effect transistors T1, T2, T3 and T4 share a common substrate, current sensing resistors R1 and R3, as well as current limiting resistors R2 and R4, should be composed of any material that does not form a diode to the substrate such as, for example, thin film resistors or polycrystalline silicon material It has been found particularly advantageous in producing a circuit in accordance with the invention to implement resistors R1 through R4 with polycrystalline silicon material separated from the substrate.

As yet another embodiment of the invention, a rectifier circuit as illustrated in FIGS. 3 and 4 may be implemented using P-well technology. For additional embodiments, where either P-well or N-well implementations are used, diodes D1 and D2 may be replaced with diode connected, low threshold MOS devices or diode connected bipolar devices.

The foregoing is illustrative of several embodiments in which the invention may be practiced. It is of course understood that the invention is not limited to the above description, but only by the following claims.

I claim:

1. A rectifier circuit comprising:
   first and second terminals for receiving an alternating current;
   third and fourth terminals for providing a rectified output voltage;
   a first field effect transistor having a gate, a drain region of first conductivity type and a source region of first conductivity type disposed in a body of second conductivity type;
   first impedance means connected between the drain region of said first field effect transistor and said first terminal;
   means electrically connecting the body and the source region of said first field effect transistor to said third terminal;
   a second field effect transistor having a gate, a drain region of first conductivity type and a source region of first conductivity type disposed in a body of second conductivity type;
   second impedance means connected between the drain region of said second field effect transistor and said first terminal;
   means electrically connecting the body and source region of said second field effect transistor to said third terminal;
   means electrically connecting the gate of said first field effect transistor to the gate of said second field effect transistor;
   means electrically connecting the gate of said first field effect transistor and the gate of said second field effect transistor to said second terminal;
   rectifier means having an anode and a cathode;
   means electrically connecting the anode of said rectifier means to said fourth terminal; and
   third impedance means connecting the cathode of said rectifier means to said second terminal.

2. The circuit of claim 1, wherein the first field effect transistor and the second field effect transistor are included on a common body of semiconductor material.

3. The circuit of claim 1 or 2, wherein the means electrically connecting the gate of said first field effect transistor and the gate of said second field effect transistor to said second terminal comprises impedance means.

4. The circuit of claim 1 or 2, wherein said first conductivity type is P.

5. The circuit of claim 1 or 2, wherein said first conductivity type is N.

6. The circuit of claim 1 or 2, wherein said first conductivity type is N and said rectifier means comprises a field effect transistor connected to function as a diode.

7. The circuit of claim 1 or 2, wherein said first, second and third impedance means are comprised of polycrystalline silicon material.

8. The circuit of claim 1 or 2, wherein said first conductivity type is P and said rectifier means comprises a field effect transistor connected to function as diode.

9. The circuit of claim 1 or 2, wherein said first conductivity type is N and said rectifier means comprises a bipolar transistor connected to function as a diode.

10. The circuit of claim 1 or 2, wherein said first conductivity type is P and said rectifier means comprises a bipolar transistor connected to function as a diode.

11. The circuit of claim 1 or 2, wherein said first, second and third impedance means are comprised of thin film resistors.

12. The circuit of claim 3, wherein said first conductivity type is P.

13. The circuit of claim 3, wherein said first conductivity type is N.

14. The circuit of claim 13, wherein said rectifier means comprises a field effect transistor connected to function as a diode.

15. The circuit of claim 12, wherein said rectifier means comprises a field effect transistor connected to function as a diode.

16. The circuit of claim 13, wherein said rectifier means comprises a bipolar transistor connected to function as a diode.

17. The circuit of claim 12, wherein said rectifier means comprises a bipolar transistor connected to function as a diode.

18. The circuit of claim 3, wherein said first impedance means, said second impedance means, said third impedance means and the impedance means connecting the gate of said first field effect transistor and the gate of said second field effect transistor to said second terminal are each comprised of polycrystalline silicon material 19. The circuit of claim 3, wherein said first impedance means, said second impedance means, said third impedance means and the impedance means connecting the gate of said first field effect transistor and the gate of said second field effect transistor to said second terminal are each comprised of thin film resistors.

* * * * *